(12) United States Patent
Schroeder et al.

(10) Patent No.: US 8,268,076 B2
(45) Date of Patent: Sep. 18, 2012

(54) SOI WAFERS HAVING $M_xO_y$ OXIDE LAYERS ON A SUBSTRATE WAFER AND AN AMORPHOUS INTERLAYER ADJACENT THE SUBSTRATE WAFER

(75) Inventors: Thomas Schroeder, Berlin (DE); Peter Storck, Burghausen (DE); Hans Joachim Muessig, Dresden (DE)

(73) Assignee: Siltronic AG, Munich (DE)

( * ) Notice: Subject to any disclaimer, the term of this patent is extended or adjusted under 35 U.S.C. 154(b) by 215 days.

(21) Appl. No.: 12/779,169

(22) Filed: May 13, 2010

(65) Prior Publication Data

US 2010/0221869 A1     Sep. 2, 2010

Related U.S. Application Data

(62) Division of application No. 12/055,356, filed on Mar. 26, 2008, now Pat. No. 7,785,706.

(30) Foreign Application Priority Data

Mar. 28, 2007 (EP) .................................. 07006387

(51) Int. Cl.
*C30B 25/18* (2006.01)

(52) U.S. Cl. .............. 117/89; 117/3; 117/88; 117/90; 117/92; 117/94; 117/101; 117/103; 117/105; 117/106; 117/108; 428/216; 428/332

(58) Field of Classification Search .......... 117/3, 88–90, 117/92, 94, 101, 103, 105–106, 108, 902, 117/947, 952; 428/216, 332
See application file for complete search history.

(56) References Cited

U.S. PATENT DOCUMENTS

| | | | |
|---|---|---|---|
| 4,246,050 A | 1/1981 | Moon | |
| 5,088,329 A | 2/1992 | Sahagen | |
| 5,159,413 A | 10/1992 | Calviello et al. | |
| 5,279,801 A | 1/1994 | Colombet et al. | |
| 5,514,904 A | 5/1996 | Onga et al. | |
| 5,912,068 A * | 6/1999 | Jia ................................. | 428/210 |

(Continued)

FOREIGN PATENT DOCUMENTS

JP         63015442 A     1/1988

(Continued)

OTHER PUBLICATIONS

T. Schroeder, et al. "Structure, twinning behavior, and interface composition of epitaxial Si(111) films on hex-Pr2O3(0001)/Si(111) support systems," J. Appl. Phys. vol. 98, p. 123513 (2005).*

(Continued)

*Primary Examiner* — Michael Kornakov
*Assistant Examiner* — Kenneth A Bratland, Jr.
(74) *Attorney, Agent, or Firm* — Brooks Kushman P.C.

(57) ABSTRACT

SOI wafers are manufactured by forming on a silicon substrate a monocrystalline first, cubic 1a-3 metal or mixed metal oxide layer whose lattice constant differs from that of the substrate by 5% or less; forming a second cubic 1a-3 mixed metal oxide layer having a lattice constant within 2% of the lattice constant of the first metal or mixed metal oxide layer, and having a graded metal content to vary the lattice content in the second mixed metal oxide layer from that of the first layer, and thermally treating the layered product in an oxygen atmosphere to form an amorphous interlayer between the substrate and the first metal or mixed metal oxide layer.

7 Claims, 4 Drawing Sheets

U.S. PATENT DOCUMENTS

| | | | |
|---|---|---|---|
| 6,045,626 | A | 4/2000 | Yano et al. |
| 6,258,459 | B1 | 7/2001 | Noguchi et al. |
| 7,011,706 | B2 * | 3/2006 | Higuchi et al. .................. 117/89 |
| 7,304,020 | B1 | 12/2007 | Tananko et al. |
| 2002/0153579 | A1 | 10/2002 | Yamamoto |
| 2002/0158245 | A1 * | 10/2002 | Yu et al. ........................... 257/43 |
| 2002/0197856 | A1 | 12/2002 | Matsuse et al. |
| 2003/0057491 | A1 | 3/2003 | Mitani et al. |
| 2005/0017304 | A1 | 1/2005 | Matsushita et al. |
| 2005/0166834 | A1 | 8/2005 | Atanackovic |
| 2005/0266663 | A1 | 12/2005 | Bojarczuk et al. |
| 2006/0157733 | A1 | 7/2006 | Lucovsky et al. |
| 2006/0232529 | A1 | 10/2006 | Midorikawa |
| 2006/0292313 | A1 | 12/2006 | Xianyu et al. |

FOREIGN PATENT DOCUMENTS

| | | |
|---|---|---|
| JP | 11260835 A | 9/1999 |
| JP | 2003168647 A | 6/2003 |
| JP | 20055590 A | 1/2005 |
| WO | 03096385 | 11/2003 |
| WO | WO 03096385 A2 * | 11/2003 |

OTHER PUBLICATIONS

T. Schroeder, et al. "Structure and thickness-dependent lattice parameters of ultrathin epitaxial $Pr_2O_3$ films on Si(001)," Appl. Phys. Lett. vol. 85, pp. 1229-31 (2004).*

M.R. Madani, et al. Low temperature oxidation of silicon, Electronics Letters, vol. 24, pp. 856-857 (1988).*

N.A. Bojarczuk, et al. "Epitaxial silicon and germanium on buried insulator heterostructures and devices," Appl. Phys. Lett. vol. 83, pp. 5443-5445 (2003).*

Liu, J.P. et al., "Epitaxial Growth of $Pr_2O_3$ on Si(111) and the Observattion of a Hexagonal to Cubic Phase Transition During Postgrowth $N_2$ Annealing," Applied Physics Letters, v. 79, n. 5, Jul. 30, 2001, pp. 671-673.

Osten, H.J. et al., "Growth of Crystalline Praseodymium Oxide on Silicon," J. of Crystal Growth 235 (2002) pp. 229-234.

Schroeder, T. et al., "Structure, Twinning Behavior, and Interface Composition of Epitaxial Si(111) Films on hex-$Pr_2O_3$ (0001)/Si(111) Support Systems," J. of Applied Physics 98, (2005), pp. 123513-123513-6.

Schroeder, T., "Structure and Thickness-Dependent Lattice Parameters of Ultrathin Epitaxial $PR_2O_3$ Films on Si (001)", Aug. 14, 2004, Applied Physics Letters, vol. 85, No. 7, pp. 1229-1231.

Narayanan, V., "Growth and Characterization of Epitaxial Si/$(La_xY_{1-x})_2O_3$/Si Heterostructures", Journal of Applied Physics, Jan. 1, 2003, vol. 93, No. 1, pp. 251-258.

* cited by examiner

SOI WAFERS HAVING $M_xO_y$ OXIDE LAYERS ON A SUBSTRATE WAFER AND AN AMORPHOUS INTERLAYER ADJACENT THE SUBSTRATE WAFER

CROSS-REFERENCE TO RELATED APPLICATIONS

This is a divisional application of copending U.S. application Ser. No. 12/055,356 filed Mar. 26, 2008, and also claims priority both to that application and to European Application No. EP 07006387 filed Mar. 28, 2007.

BACKGROUND OF THE INVENTION

1. Field of the Invention

The present invention is related to a layered semiconductor wafer and a process for its production.

2. Background Art

SOI wafers ("semiconductor on insulator") comprise a substrate wafer ("handle wafer" or "base wafer"), generally consisting of monocrystalline silicon, a layer of an electrically insulating material (the so-called "buried oxide layer", BOX) and a superficial layer of semiconductor material ("top layer" or "device layer") connected thereto, which represents the so called active layer that is provided for the production of electronic components.

SOI wafers can be manufactured by various methods. One widely used method is to transfer a thin layer of semiconductor material from a donor wafer to the substrate wafer. Prior to this transfer, the surfaces of the donor wafer or of the substrate wafer or both are oxidized in order to form the insulating layer. This method is referred to as "layer transfer". In a second method, an insulating layer can be directly formed within a silicon substrate wafer by implanting oxygen ions into one of its surfaces and annealing the substrate wafer subsequently in order to form a silicon oxide layer. This method is called "SIMOX".

The first method (layer transfer) is costly due to work intensive process steps. It is well developed for silicon and within limits for germanium but not for alternative semiconductors like gallium nitride (GaN), zinc oxide (ZnO) or other materials to be used for the active layer. Furthermore, it is limited to semiconductor materials for which bulk wafers of appropriate diameter exist, which is however a problem for many interesting materials like silicon carbide (SiC), gallium arsenide (GaAs) or gallium nitride (GaN).

The second method (SIMOX) is limited to materials for which bulk wafers of appropriate diameters exist and for which ion implantation and formation of a buried oxide layer by post implantation annealing steps is feasible. It is cost intensive due to the required equipment, especially for the ion implantation, and due to long processing times.

Subsequent deposition of heteroepitaxial buried oxide and semiconductor layers on a silicon wafer provide a third method of manufacturing SOI wafers, as for example described for epi-Si/hexagonal $Pr_2O_3$/Si systems in the papers H. J. Osten et al., "*Growth of crystalline praseodymium oxide on silicon*", *Journal of Crystal Growth* 235 (2002), 229-234 and T. Schröder et al., "*Structure, twinning behavior, and interface composition of epitaxial Si*(111) *films on hex-$Pr_2O_3$*(0001)/*Si*(111) *support systems*", *Journal of Applied Physics* 98 (2005), 123513-1-123513-6. This method includes epitaxially depositing an insulator layer consisting of praseodymium oxide having a hexagonal crystal structure on a silicon substrate wafer and subsequently a silicon layer on the insulator layer.

WO03/096385A2 discloses a method similar to Osten, op. cit., disclosing cesium oxide ($CeO_2$), aluminium nitride (AlN) and lanthanum aluminium oxide ($LaAlO_3$) as materials for the insulator layer. These materials have lattice constants and cubic crystal structures close to those of silicon. Ternary materials like $LaAlO_3$ can be used to adapt the lattice constant of the insulator layer to the overlying semiconductor layer (e.g. silicon-germanium, SiGe). Optionally, a thin layer of amorphous silicon oxide can be grown at the interface between the silicon substrate wafer and the epitaxially deposited insulator layer by a thermal treatment under an oxidizing atmosphere. This layer is preferably formed if a dielectric having a low dielectric constant is required. WO03/096385A2 does not recite any further effects of this silicon oxide layer.

It has been found, however, that SOI wafers produced according to the processes disclosed in WO03/096385A2 have several disadvantages when they are used as substrates for the production of electronic devices, described below.

First, the adaptation of the lattice constant is only possible in a very limited range: $La_2O_3$, $LaAlO_3$ and $Al_2O_3$ have different crystal structures. $La_2O_3$ has a cubic Ia-3 crystal structure whereas $Al_2O_3$ has a corundum structure with R3CH symmetry. When both oxides are mixed, a variety of structures results depending on the La/Al ratio, e.g., $LaAlO_3$ has a perovskite-like structure with R-3mR symmetry at room temperature. Due to the different structures it is not possible to mix $La_2O_3$ and $Al_2O_3$ in any desired ratio from 0 up to 1, i.e. miscibility gaps exist. The perovskite-like structure only exists for La/Al ratios from about 0.8 to about 1.2. In addition, this structure is not suitable for epitaxially depositing monocrystalline cubic semiconductor materials thereon.

Second, incomplete decoupling of the buried oxide lattice from the silicon substrate results in defect generation a) by misfit strain and b) by thermal mismatch due to different thermal expansion coefficients of the materials in the heterostructure. For example, the latter effect results in microcrack formation in the SOI structures during thermal ramping (annealing as well as cooling down cycles) in the production of the SOI wafer as well as during processing of IC devices.

Third, the insulator layer and the thin additional silicon oxide layer together provide insufficient isolation. Epitaxial oxides exhibit in general rather high leakage currents due to the absence of grain boundaries which are perpendicularly oriented with respect to the current path and which thus block leakage current. Thin amorphous $SiO_2$ layers are also not efficient due to having thicknesses in the regime of direct tunneling phenomena. Thicker $SiO_2$ layers cannot be achieved in every case, and then only if the wafer is annealed at a high temperature. High temperature annealing, however, degrades the crystallinity of the epitaxial oxide layer and thus destroys the basis for perfect growth of the superficial semiconductor layer. This becomes evident because a "repair anneal" is recommended following the oxidation step (WO03/096385A2, page 5 line 16). Furthermore, precise control of the interface state densities is required to avoid hysteretic floating body effects in the buried oxide by parasitic charge trapping effects.

SUMMARY OF THE INVENTION

It is therefore an object of the present invention to provide a substrate for the production of an SOI (semiconductor on insulator) structure which allows a high flexibility to adjust the lattice dimensions of the insulator layer for the integration of either fully relaxed or strained semiconductor layers consisting of a variety of materials with high crystalline quality.

It is a further object to achieve sufficient lattice decoupling and insulation between the semiconductor layer and the substrate wafer. An oxide structure is needed whose interface with the Si substrate can be precisely controlled by the preparation of an interface layer with parameters appropriate for the desired application. These and other objects are achieved with a monocrystalline silicon substrate onto which is deposited a first amorphous insulating layer of low thickness, and a monocrystalline metal oxide or mixed metal oxide layer having a lattice constant which differs from the lattice constant of the substrate by from 0% to 5%. A device layer may subsequently be deposited.

DETAILED DESCRIPTION OF THE PREFERRED EMBODIMENT(S)

The present invention thus relates to a semiconductor wafer comprising the following layers in the given order:
 a monocrystalline substrate wafer 1 consisting essentially of silicon,
 a first amorphous intermediate layer 2 comprising an electrically insulating material and having a thickness of 2 nm to 100 nm,
 a monocrystalline first oxide layer 3 having a cubic Ia-3 crystal structure, a composition of $(M^1_2O_3)_{1-x}(M^2_2O_3)_x$ wherein each of $M^1$ and $M^2$ is a metal and wherein $0\leq x\leq 1$, and a lattice constant which differs from the lattice constant of the material of the substrate wafer by 0% to 5%.

The present invention also relates to processes for manufacturing the wafers of the invention. A first process for manufacturing the semiconductor wafer described above comprises the following steps in the given order:
a) providing the substrate wafer 1,
b) epitaxially depositing the first metal oxide layer 3 on at least one surface of the substrate wafer 1, and
e) thermally treating the resulting layered wafer under an atmosphere comprising oxygen with a partial pressure of $10^{-6}$ mbar to 1 bar at a temperature of 200 to 1000° C. for 10 to 100 minutes, thereby forming the first amorphous intermediate layer 2 at the boundary between the substrate wafer 1 and the first oxide layer 3.

A second process for manufacturing the semiconductor wafer described above, comprises the following steps in the given order:
a) providing the substrate wafer 1, the substrate wafer having a crystal lattice orientation of Si(111),
b) epitaxially depositing a first metal oxide layer 31 on at least one surface of the substrate wafer 1, the first oxide layer 31 having a hexagonal crystal structure, a composition of $(M^1_2O_3)_{1-x}(M^2_2O_3)_x$ wherein each of $M^1$ and $M^2$ is a metal and wherein $0\leq x\leq 1$, and a lattice constant which differs from the lattice constant of the material of the substrate wafer by 0% to 5%, and
e) thermally treating the resulting layered wafer under an atmosphere comprising oxygen with a partial pressure of $10^{-6}$ mbar to 1 bar at a temperature of 200 to 1000° C. for 10 to 100 minutes, thereby transforming the first oxide layer 31 having a hexagonal crystal structure into the first oxide layer 3 having a cubic Ia-3 crystal structure, and thereby also forming the first amorphous intermediate layer 2 at the boundary between the substrate wafer 1 and the first oxide layer 3.

In the first step a) (FIGS. 1 and 2), a monocrystalline substrate wafer 1 is provided, which consists essentially of single-crystalline silicon, preferably it consists of 90% to 100% silicon, more preferably of 98% to 100% silicon. The substrate wafer may comprise the usual dopants or impurities generally known in the field of silicon technology. The substrate wafer 1 preferably has a crystal lattice orientation of Si(001), Si(111) or Si(110).

Figure 1:
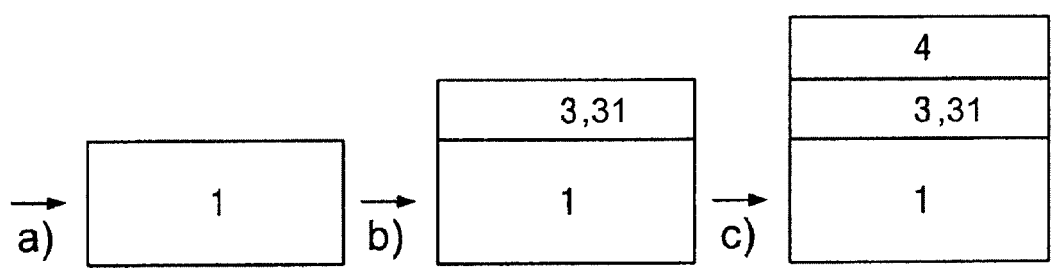
FIG. 1 schematically illustrates a first embodiment of the present invention wherein a superficial layer 8 consisting of a semiconductor material is deposited directly on the surface of a second oxide layer 4.
Figure 1:
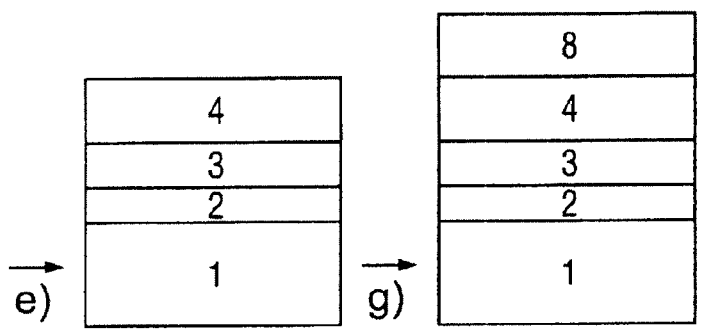
Figure 2:
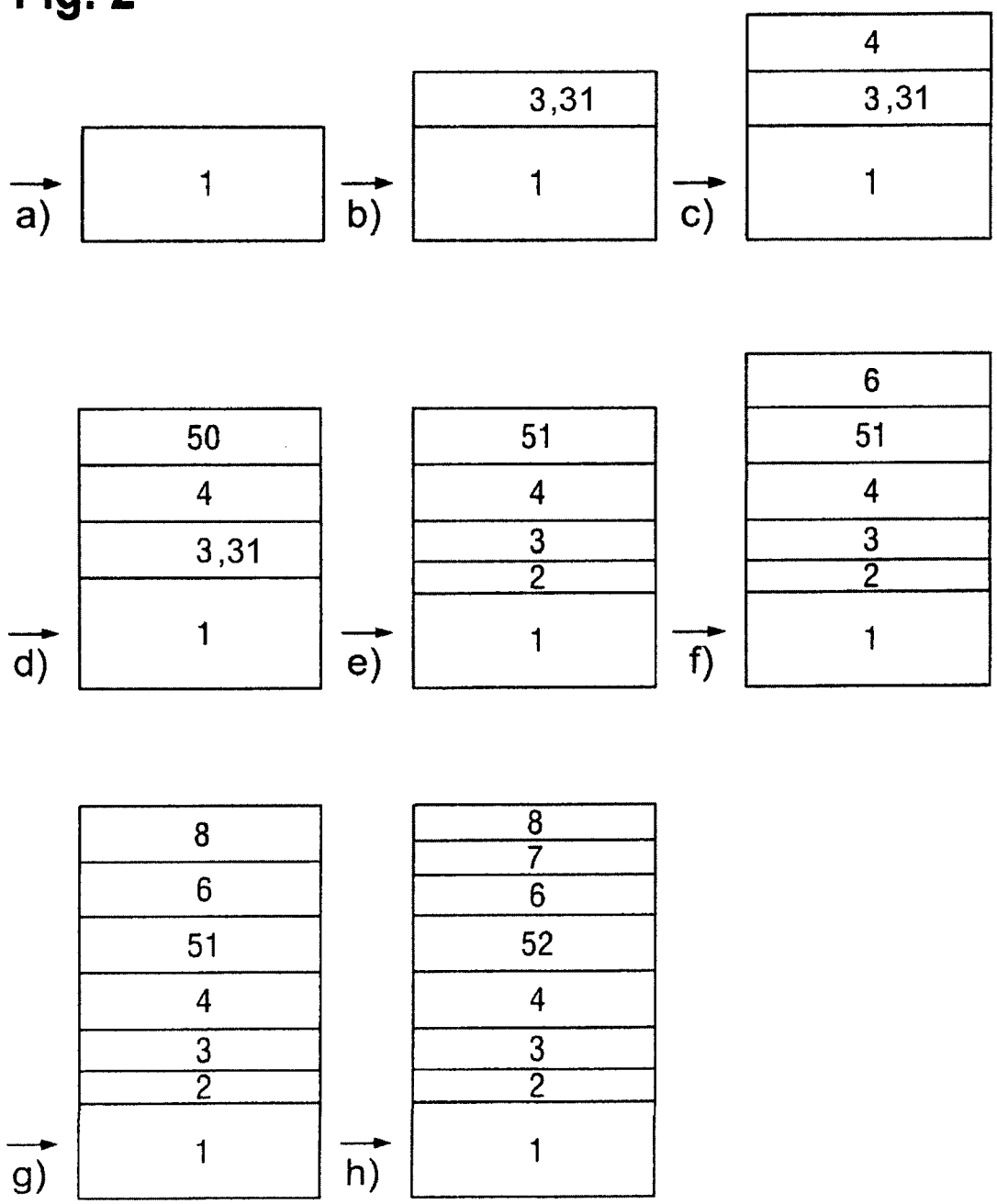
FIG. 2 schematically illustrates a second embodiment of the present invention wherein a third oxide layer 51 consisting of $M^5_2O_w$ adjacent to the second oxide layer 4, wherein $M^5$ is a metal and wherein $3<w\leq 4$, is formed on the second oxide layer 4.

According to the present invention, a monocrystalline first oxide layer 3 is epitaxially deposited on at least one surface of the substrate wafer 1 in step b) of the process (FIGS. 1 and 2). The first oxide layer 3 has a composition of $(M^1_2O_3)_{1-x}(M^2_2O_3)_x$ wherein each of $M^1$ and $M^2$ is a metal. In order to guarantee a 100% miscibility, it is preferred to use metals $M^1$ and $M^2$ whose oxides $M^1_2O_3$ and $M^2_2O_3$ have Ia-3 symmetry. Preferably, each of $M^1$ and $M^2$ is a rare earth metal or a transition metal, most preferably, $M^1$ is praseodymium and $M^2$ is yttrium. $Pr_2O_3$ is about 2% too big, $Y_2O_3$ is about 2% too small with respect to Si. Therefore, this mixture allows on a 50:50 basis, i.e. $(Pr_2O_3)_{0.5}(Y_2O_3)_{0.5}$, to meet the lattice dimensions of Si. Furthermore, it offers the advantage to end with $Pr_2O_3$ and integrate by oxidation the "internal oxygen reservoir" $PrO_2$, which is described in step d) below. However, this is just one example of several possibilities. The index x satisfies the inequality $0\leq x\leq 1$, and preferably satisfies the inequality $0\leq x\leq 1$, and is adapted such that the lattice constant of the first oxide layer 3 differs from the lattice constant of the material of the substrate wafer by 0% to 5%, preferably 0% to 2%. None of the oxides meets perfectly the lattice dimensions of Si. Only by mixing, can it be matched perfectly.

Preferably, the first oxide layer 3 has a uniform composition and thus a uniform lattice constant across its entire thickness. However, it is also possible to start immediately with a composition gradient. Preferably, the thickness of the first oxide layer 3 is at least 1 nm.

The first oxide layer 3 has a cubic Ia-3 crystal structure. In most cases, especially if the surface of the substrate wafer 1 is (001) or (110) orientated, the first oxide layer 3 can be epitaxially grown directly on the surface of the substrate wafer 1 in step b). If the substrate wafer 1 has a (111) orientated surface, however, it is not always possible to grow a cubic Ia-3 oxide directly. For example, $Pr_2O_3$ grows as a hexagonal phase on a Si(111) surface. If a direct growth of a cubic oxide is not possible, a first oxide layer 31 having a hexagonal crystal structure is deposited in step b) on at least one surface of the substrate wafer 1. This layer is then transformed into the (thermodynamically stable) first oxide layer 3 having a cubic Ia-3 crystal structure. This phase transition is automatically achieved during the thermal treatment of step e), which is described below. It is also possible to split the thermal treatment into a phase transition and an interface optimization step.

In an optional step c) (FIGS. 1 and 2), a monocrystalline second oxide layer 4 can be epitaxially deposited on the surface of the first oxide layer 3. The second oxide layer 4 also has a cubic Ia-3 crystal structure and a composition of $(M^3{}_2O_3)_{1-y}(M^4{}_2O_3)_y$, wherein each of $M^3$ and $M^4$ is a metal. In order to guarantee 100% miscibility, it is preferred to use metals $M^3$ and $M^4$ whose oxides $M^3{}_2O_3$ and $M^4{}_2O_3$ have Ia-3 symmetry. Preferably, each of $M^3$ and $M^4$ is a rare earth metal or a transition metal, most preferably, $M^3$ is praseodymium and $M^4$ is yttrium. The index y satisfies the inequality $0 \leq y \leq 1$, and preferably satisfies the inequality $0 \leq y \leq 1$. The second oxide layer 4 has a composition which varies along the thickness of the layer. y starts with a value $y^1$ at the interface to the first oxide layer 3 and varies across the thickness of the second oxide layer 4 in order to achieve a variation in the lattice constant of the material of the second oxide layer 4 across its thickness. y ends with a value $y^2$ at the surface of the second oxide layer 4. The value $y^1$ is selected such that the lattice constant of the second oxide layer 4 at its boundary to the first oxide layer 3 differs from the lattice constant of the material of the first oxide layer 3 by 0% to 2% in order to guarantee single crystalline oxide growth with limited defect densities. Preferably, the value $y^2$ is selected dependent from the lattice constant of the layer which is to be deposited on the surface of the second oxide layer 4 in order to achieve a lattice match between the layers. In order to minimize defect densities in the second oxide layer 4, the change in its lattice constant by variation of the concentration gradient between $y^1$ and $y^2$ is preferably optimized with respect to the interplay between strain effects on the one hand and defect nucleation energies on the other hand in the oxide components of interest.

Step c) can be omitted if any additional layer (e.g. a superficial layer 8 consisting of a monocrystalline semiconductor material or a third oxide layer 50) that is to be deposited on the surface of the second oxide layer 4, has approximately the same lattice constant as the first oxide layer 3. If this is not the case, it is preferable to perform step c) which allows to adapt the value $y^1$ to the lattice constant of the adjacent first oxide layer 3, vary the composition of the second oxide layer across its thickness in an appropriate way, and to end with a value $y^2$ adapted to the lattice constant of the next layer to be deposited.

In a further optional step d) (FIG. 2) a monocrystalline third oxide layer 50 having a cubic Ia-3 crystal structure and a composition of $M^5{}_2O_3$ is epitaxially deposited at the surface of the second oxide layer 4. $M^5{}_2O_3$ is a metal oxide which can be further oxidized to a higher oxide with a composition of $M^5{}_2O_w$ with $3 < w \leq 4$. Typical examples are praseodymium (Pr) and terbium (Tb) showing various oxide phases $M^5{}_2O_w$ with w ranging from 3 to 4, but also the special cases of cerium dioxide ($CeO_2$) and neodymium dioxide ($NdO_2$) where w=4. Step d) is performed after step b) or after steps b) and c) and prior to step e). If this step is applied, the third oxide layer 50 consisting of $M^5{}_2O_3$ will be further oxidized and thus transformed into a third oxide layer 51 consisting of $M^5{}_2O_w$, wherein $3 < w \leq 4$, during the following step e). The latter layer serves as an oxygen reservoir which facilitates the formation of a second amorphous intermediate layer 7 during a further thermal treatment which will be described as step h) below. The thickness of this layer is preferably in the range from 1 nm to 100 nm.

In a further step e) (FIGS. 1 and 2), the resulting layered wafer is thermally treated under an atmosphere comprising oxygen with a partial pressure of $10^{-6}$ mbar to 1 bar at a temperature of 200 to 1000° C., preferably of 300 to 600° C., for 10 to 100 minutes. Oxygen can be supplied in the form of molecular oxygen ($O_2$ or ozone, $O_3$) or in the form of oxygen compounds like dinitrogen monoxide ($N_2O$) or in the form of atomic oxygen. It is also possible to use an oxygen-containing plasma. This thermal treatment forms a first amorphous intermediate layer 2 at the interface between the substrate wafer 1 and the first oxide layer 3. The first amorphous intermediate layer 2 has a thickness of 2 nm to 100 nm, preferably of 3 nm to 10 nm. Depending on the material of the first oxide layer 3, the first amorphous intermediate layer 2 comprises a silicon oxide or a metal silicate or both. The thickness of the first intermediate amorphous layer 2 is determined by the conditions (temperature, duration, oxygen partial pressure, the form of supplied oxygen) of the thermal treatment. Therefore, the conditions of the thermal treatment are chosen in order to achieve an intermediate amorphous layer 2 having the desired thickness and thus the desired electrical properties. The purpose of the first amorphous intermediate layer 2 is twofold, namely to firstly decouple the lattice of the first oxide layer 3 and the optional further oxide layers from the rigid Si substrate wafer 1 to avoid thermal mismatch problems (defect generation, film cracking etc.) and secondly to optimize the electrical properties of the engineered wafer structure (leakage currents typically smaller than $10^{-8}$ A/cm$^2$ at 1 V; capacitance with effective dielectric constant values between 4 and 16, density of interface states below $10^{12}$/cm$^2$, high electric breakdown fields of the box oxide up to 10 MV/cm etc.).

For example, the post-deposition oxidation of the boundary between the silicon substrate wafer 1 and the first oxide layer 3 is carried out in case of single crystalline cubic $Y_2O_3$ oxide layers on Si(111) by heating the system in 1 atmosphere of molecular oxygen for 30 minutes at 600° C., resulting in a 6 nm thick amorphous intermediate layer 2 consisting of yttrium silicate. The effectiveness of the amorphous intermediate layer 2 in terms of improving the structural and electrical properties of the hetero-structure is controlled as described in the following text. Concerning the structure, the decoupling of the oxide film from the rigid silicon substrate 1 is controlled by the fact that the cubic $Y_2O_3$ film is completely relaxed after the treatment. In particular, the substrate-induced strain in the oxide film structure is released and the single crystalline oxide film floats on the amorphous interface layer 2, adopting in that manner its bulk structure with the corresponding lattice spacing. In this situation, thermal mismatch problems between the film and the substrate are avoided so that $Y_2O_3$ films show improved crystalline quality with respect to the case of rigidly coupled $Y_2O_3$/Si(111) hetero-structures. Concerning the electrical properties, the amorphous intermediate layer reduces the leakage current at $\pm 1$ V to values below $10^{-8}$ A/cm$^2$ and achieves dielectric breakdown fields as high as 8 MV/cm. Furthermore, interface state densities below $10^{11}$/cm$^2$ can be realized by the formation of the amorphous intermediate layer after applying additional gas treatments (e.g. forming gas annealing etc.).

The formation of this first amorphous intermediate layer 2 of the specified thickness requires the diffusion of oxygen from the atmosphere through at least the first oxide layer 3 to the interface between the latter layer and the silicon substrate wafer 1. The stack of oxide layers may have a thickness of several tens of nanometers. In comparison to WO03/096385A2, this diffusion is considerably facilitated by the materials specified for the first oxide layer 3 and optional further oxide layers according to the present invention. Oxygen conductivity in oxides is a special case of ionic conduction. The mass transport takes place by hopping processes of the involved ions, in this case oxygen anions, to special lattice sites (interstitials, defects, etc.) which requires in any case a certain flexibility of the host matrix. $M_2O_3$ oxides with Ia-3 crystal structure belong to the so called ordered oxygen vacancy crystal structures. This inherent vacancy structure of $M_2O_3$ oxides with Ia-3 crystal structure provides the flexibility of the crystal lattice to allow for the diffusion of oxygen even at temperatures as low as 200° C., placing these compounds among the best oxygen conductors known. The inventors found that if the first oxide layer 3 consists of $(M^1{}_2O_3)_{1-x}(M^2{}_2O_3)_x$ having Ia-3 symmetry, a sufficiently thick first amorphous intermediate layer 2 can be formed during the thermal treatment of step e) even at relatively low temperatures. A low temperature oxidation anneal is able to preserve the crystallinity of the epitaxial oxide layers. Generally, according to the Tamm rule of solid state chemistry, ion mobility in oxides is negligible for temperatures below approximately half the melting temperature. However, it is important for the present invention that the Tamm rule is known to hold for the metal cation, but not for the oxygen sublattice of cubic Ia-3 crystal structures. In particular, as melting temperatures of the cubic Ia-3 crystal structures are typically well above 2000° C., no substantial metal cation mass transport occurs below 1000° C., but high oxygen mobilities are detected even at temperatures as low as 300° C. This property of $A_2O_3$ oxides with the Ia-3 crystal structure opens a large temperature window to, on the one hand prepare the amorphous intermediate layer 2 in an oxidizing ambient underneath the buffer oxide film comprising oxide layers 3, 4, 50 with the desired properties, but, on the other hand to avoid undesired metal cation diffusion into the Si substrate wafer 1. Metal contaminations in the Si substrate must be strictly avoided because these impurities are generally known to negatively affect the electric properties of the wafer structure (carrier lifetimes, mobilities etc.).

If optional step d) was performed prior to step e), the thermal treatment of step e) not only forms the first amorphous intermediate layer 2, but also further oxidizes the $M^5{}_2O_3$ of the third oxide layer 50 to $M^5{}_2O_w$ with $3<w\leq4$ as explained above, and thus transforms it into third oxide layer 51 (FIG. 2). If $M^5$ is praseodymium, w=4 after the oxidation, i.e. $PrO_2$ is formed. This layer serves as an internal oxygen reservoir in further step h).

In an optional step f) (FIG. 2), a monocrystalline fourth oxide layer 6 can be epitaxially deposited on the surface of the third oxide layer 51. The fourth oxide layer 6 also has a cubic Ia-3 crystal structure and a composition of $(M^6{}_2O_3)_{1-z}(M^7{}_2O_3)_z$ wherein each of $M^6$ and $M^7$ is a metal. In order to guarantee a 100% miscibility, it is preferred to use metals $M^6$ and $M^7$ whose oxides $M^6{}_2O_3$ and $M^7{}_2O_3$ have Ia-3 symmetry. Preferably, each of $M^6$ and $M^7$ is a rare earth metal, a transition metal like scandium (Sc), yttrium (Y) or manganese (Mn) or a main group metal like indium (In), thallium (Tl), antimony (Sb) or bismuth (Bi). The index z satisfies the inequality $0\leq z\leq 1$, preferably the inequality $0<z<1$. Similar to the second oxide layer 4, the fourth oxide layer 6 has a composition which varies along the thickness of the layer. z starts with a value $z^1$ at the interface to the third oxide layer 51 and varies across the thickness of the fourth oxide layer 6 in order to achieve a variation in the lattice constant of the material of the fourth oxide layer 6 across its thickness. z ends with a value $z^2$ at the surface of the fourth oxide layer 6. The metals $M^6$ and $M^7$ as well as the value $z^1$ may be selected such that the lattice constant of the fourth oxide layer 6 at its boundary to the third oxide layer 51 matches the lattice constant of the latter layer. Also preferably, the metals $M^6$ and $M^7$ as well as the value $z^2$ is selected dependent from the lattice constant of the layer which is to be deposited on the surface of the fourth oxide layer 6 in order to achieve a lattice match between the layers.

Step f) is preferably performed only in conjunction with steps d) and e), in the sequence d)→e)→f). If step d) is omitted, i.e. if no third oxide layer 50 consisting of $M^5{}_2O_3$ is deposited, which is afterwards oxidized to $M^5{}_2O_w$ with $3<w\leq4$, there is no need for a fourth oxide layer 6. The fourth oxide layer 6 primarily serves to adapt the lattice constant from the value of the third oxide layer to the value of a further, additional layer to be deposited on the surface of the fourth oxide layer 6, e.g. a superficial layer 8 consisting of a semiconductor material.

Figure 3:
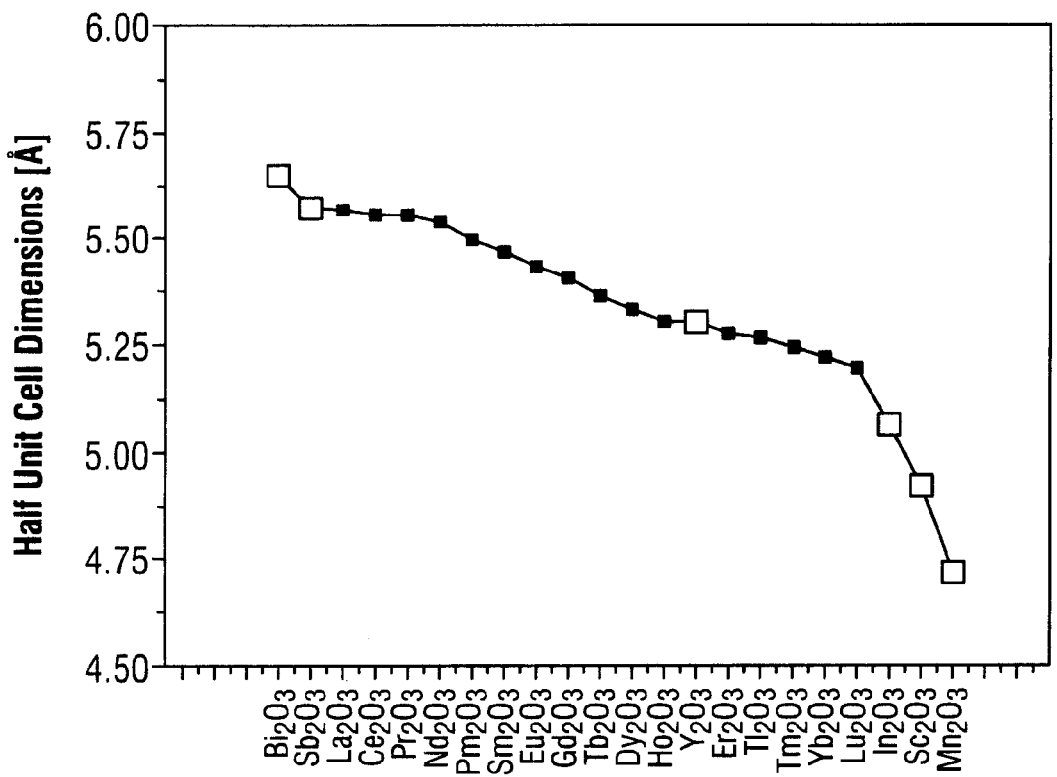
FIG. 3 shows the half unit cell dimensions (in Å) of various cubic metal oxides having Ia-3 symmetry.
Figure 4:
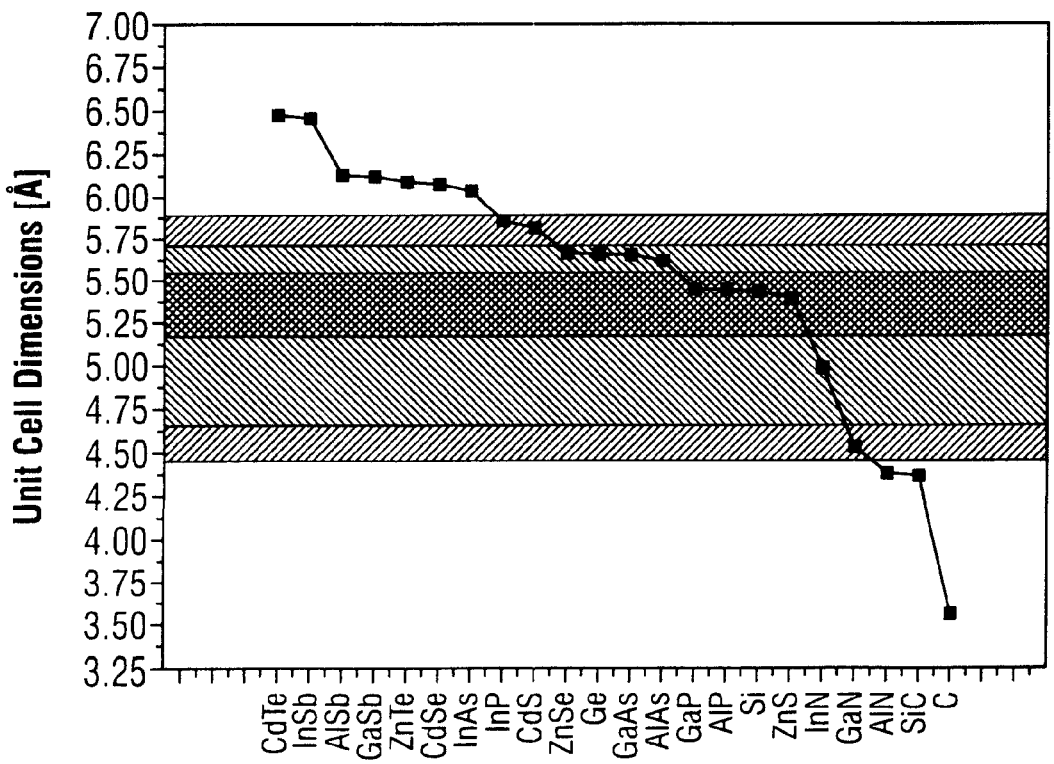
FIG. 4 shows the unit cell dimensions of cubic semiconductor materials.

Even if a third oxide layer 51 consisting of $M^5{}_2O_w$ with $3<w\leq4$ is present, step f) can be omitted if any additional layer (e.g. a superficial layer 8 consisting of a monocrystalline semiconductor material) that is to be deposited on the surface of the fourth oxide layer 6, has approximately the same lattice constant as the third oxide layer 3. If this is not the case, it is preferable to perform step f) which allows to adapt the value $z^1$ to the lattice constant of the adjacent third oxide layer 51, vary the composition of the fourth oxide layer across its thickness in an appropriate way and to end with a value $z^2$ adapted to the lattice constant of the next layer to be deposited. (Examples of lattice constants are shown in FIGS. 3 and 4.)

The expression "adapted to the lattice constant" can either mean lattice-matched or lattice-mismatched in a defined manner. If the next layer shall be a compressively strained layer, the adjacent oxide layer must have a smaller lattice constant than the next layer. If the next layer shall show a tensile strain, the adjacent oxide layer must have a larger lattice constant. This principle is valid for any interface between an oxide layer and a superficial layer 8 consisting of a monocrystalline semiconductor material. For example, in case of a superficial layer 8 consisting of pure silicon, a tensile strain by more than 2% misfit is required to achieve IC relevant performance increases due to higher charge carrier mobility.

The layered semiconductor wafer according to the present invention, comprising at least a silicon substrate wafer 1, a first amorphous intermediate layer 2 and a first oxide layer 3, can be advantageously used as a substrate for the epitaxial deposition of a superficial layer 8 consisting of a semiconductor material. This layer can be deposited in a further, optional step g) (FIGS. 1 and 2) either on the surface of the first oxide layer 3 (i.e. after steps a), b) and e); FIGS. 1 and 2), on the surface of the second oxide layer 4 (i.e. after steps a), b), c) and e); FIG. 1), on the surface of the third oxide layer 51 (i.e. after steps a), b), (c)), d) and e); FIG. 2) or on the surface of the fourth oxide layer 6 (i.e. after steps a), b), (c)), d), e) and f); FIG. 2).

The semiconductor material of the superficial layer 8 may be, for example: Group IV semiconductors like silicon (Si), germanium (Ge), silicon-germanium ($Si_{1-a}Ge_a$, $0<a<1$), silicon carbide (SiC); III-V semiconductors like gallium phosphide (GaP), aluminium phosphide (AlP), gallium nitride (GaN), gallium arsenide (GaAs), aluminium arsenide (AlAs), indium arsenide (InAs), indium nitride (InN), indium phosphide (InP), semiconductors which perfectly match the GaAs lattice like gallium indium phosphide ($Ga_{0.51}In_{0.49}P$) or indium arsenic phosphide ($In_{0.51}As_{0.49}P$); II-VI semiconductors like zinc sulphide (ZnS) and zinc oxide (ZnO). All materials are single-crystalline.

The stack of oxide layers has a cubic Ia-3 crystal structure and in any case the same orientation as the substrate wafer 1 (i.e. (001) on a Si(001) wafer, (110) on a Si(110) wafer and (111) on a Si (111) wafer). The superficial layer 8 can have the following structures and orientations: If a Si(001) wafer is used as the substrate 1, the superficial layer 8 also has a cubic crystal structure and (001) orientation. If a Si(110) wafer is used as the substrate 1, the superficial layer 8 also has a cubic crystal structure and (110) orientation. If a Si(111) wafer is used as the substrate 1, the superficial layer 8 may either have a cubic crystal structure and (001) orientation or a hexagonal structure and (0001) orientation.

The superficial layer 8 can be either relaxed or strained. If it is intended to deposit a strained layer of semiconductor material, the thickness of this layer shall not exceed the critical thickness for pseudomorphic growth. The superficial layer 8 preferably has a thickness of 10 nm to 50 μm depending on the targeted application.

In a further, optional step h) the resulting layered wafer is thermally treated at a temperature of 200 to 1000° C., preferably of 300 to 600° C., for 10 to 100 minutes, thereby forming a second amorphous intermediate layer 7 at the interface between the fourth oxide layer 6 and the superficial layer 8. This second amorphous intermediate layer 7 preferably has a thickness of 0.5 nm to 100 nm, more preferably from 2 nm to 100 nm and most preferably from 3 nm to 10 nm. Depending on the material of the adjacent oxide layer (in general the fourth oxide layer 6), the second amorphous intermediate layer 7 comprises a silicon oxide or a metal silicate or both. The importance of the second amorphous intermediate layer 7 depends on the application. For example, in case of fully depleted CMOS technologies, it is required to avoid undesired back channel and cross talks effects due to the excessive capacitance and leakage values of epitaxial oxide layers.

The thickness of the second intermediate amorphous layer 7 is determined by the conditions (i.e. temperature and duration) of the thermal treatment. For example, it was found that a 5 nm thick amorphous intermediate layer 7 consisting of praseodymium silicate forms between an epitaxial silicon layer 8 and a $Pr_2O_3$ based buffer oxide layer 6 with an embedded $PrO_2$ layer 51 when the hetero-structure is annealed in a protective nitrogen atmosphere for 30 minutes at 600° C. The second amorphous intermediate layer 7 serves the same goals as the first amorphous interface layer 2, namely to decouple the semiconductor layer 8 from the rigid, supporting heterostructure to avoid thermal mismatch problems and to improve the electrical properties. Typical parameters are given in the description of the preparation of the amorphous interface layer 2.

The optional step h) is preferably applied only after a superficial layer 8 was deposited in step g), i.e. only in conjunction with step g). Step h) is preferably performed immediately after step g) without cooling the layered wafer between the two steps. This allows avoiding defect creation by different thermal expansion coefficients of the oxide and the semiconductor of the superficial layer 8 as well as to guarantee high quality electric properties (insulation, low charge trapping densities etc.).

The formation of the first amorphous intermediate layer 2 of the specified thickness requires the diffusion of oxygen from the atmosphere through at least the first oxide layer 3 to the interface between the latter layer and the silicon substrate wafer 1. As at the time of the formation of the second amorphous intermediate layer 7, the surface of the semiconductor wafer is covered by a superficial layer 8 consisting of a semiconductor material, the diffusion of oxygen from an oxygen containing atmosphere into the semiconductor wafer is substantially blocked. Therefore it is hardly possible to use an oxygen containing atmosphere to oxidize the interface between the superficial layer 8 consisting of a semiconductor material. As this oxidation is nevertheless necessary for the formation of the second amorphous intermediate layer 7, it is preferable to integrate an internal oxygen source into the stack of oxide layers. This role can be taken preferably by the above-mentioned third oxide layer 51 consisting of $M^5_2O_w$ with $3<w\leq4$ (produced by deposition of a layer of $M^5_2O_3$ in step d) and oxidation of this layer in step e) as described above). During the thermal treatment in step h) $M^5_2O_w$ is reduced to $M^5_2O_3$ again. The superfluous oxygen can easily diffuse through the fourth oxide layer 6 (if present) and oxidize the semiconductor material at the interface between the superficial layer 8 consisting of semiconductor material and the adjacent oxide layer (e.g. the fourth oxide layer 6). For example, $PrO_2$ is under normal conditions a stable oxide compound. However, in contact with semiconductor materials, the oxidation reaction at the interface is facilitated by the relatively loosely bound lattice oxygen in $PrO_2$. In consequence, $PrO_2$ is reduced to $Pr_2O_3$ at temperatures above 300° C. when the external oxygen supply is cut, and an oxide of the semiconductor film forms at the interface. Depending on the materials in contact, $Pr_2O_3$ can mix with this semiconductor oxide, as is the case for example with $SiO_2$ resulting in the formation of praseodymium silicates.

Compared to WO03/096385A2, the semiconductor wafer according to the present invention has the following advantages:

First of all, the inventors found that the mixed metal oxides with a cubic Ia-3 structure with adjustable lattice parameters can be easily deposited on a silicon substrate wafer using epitaxial growth methods. They match the cubic crystal lattice of silicon much better than the materials with adjustable lattice parameters given in WO03/096385A2 having hexagonal (AlN: P63mc) or triclinic ($LaAlO_3$: R-3mR) symmetries.

In addition, the present invention overcomes the inherent inflexibility of the hetero-epitaxy approaches which usually results in highly specialised systems, as is the case for WO03/096385A2. The mixed buffer oxide approach of the present invention is based on cubic Ia-3 $A_2O_3$ crystal structures which are quite common over the periodic system and can therefore be adapted to a high number of valuable semiconductor materials for the superficial layer 8.

As an example, FIG. 3 depicts the half unit cell dimensions (in Å; 1 Å=0.1 nm) of various cubic metal oxides which can be used as $M^6_2O_3$ and $M^7_2O_3$, but also, as the case may be, as $M^1_2O_3$, $M^2_2O_3$, $M^3_2O_3$ or $M^4_2O_3$. The unit cell dimensions of all cubic $M_2O_3$ Ia-3 crystal structures are within a few percent twice as big as the lattices of the most common cubic semiconductor structures. In this way, the heteroepitaxy of these oxides on the cubic semiconductors results in the formation of a (2×2) coincidence lattice as the most dense configuration. For an easier evaluation of lattice matching opportunities, the unit cell dimensions of the cubic semiconductors (FIG. 4) are compared with half the values of the lattice dimensions of the cubic $M_2O_3$ Ia-3 oxides (FIG. 3).

FIGS. 3 and 4 are applicable if the substrate wafer 1 has a Si(001) surface orientation. By mixing two of these binary metal oxides, the whole range of lattice constants between the lattice constants of the binary oxides is achievable. All binary metal oxides having a cubic Ia-3 crystal structure are 100% miscible. Therefore one can easily select the appropriate metal oxides fitting to the silicon substrate wafer 1 on one hand ($M^1_2O_3$, $M^2_2O_3$, $M^3_2O_3$, $M^4_2O_3$) and to the semiconductor material of the superficial layer 8 on the other hand ($M^6_2O_3$ and $M^7_2O_3$). As can be seen in FIG. 3, half unit cell dimensions in the wide range from about 0.47 nm to about 0.57 nm are available. FIG. 4 shows the unit cell dimensions (in Å) of some cubic semiconductor materials which can be used as materials for the superficial layer 8. The dark grey area covers the range of lattice parameters that can be matched by mixing only $M_2O_3$ Ia-3 oxides with M being a rare earth element. The grey area includes lattice parameters that can be matched by mixing $M_2O_3$ Ia-3 oxides with M being a rare earth element, transition metal or main group element. The light grey area covers lattice parameters that can be matched within ±4% by mixing $M_2O_3$ Ia-3 oxides with M being a rare earth element.

Figure 5:
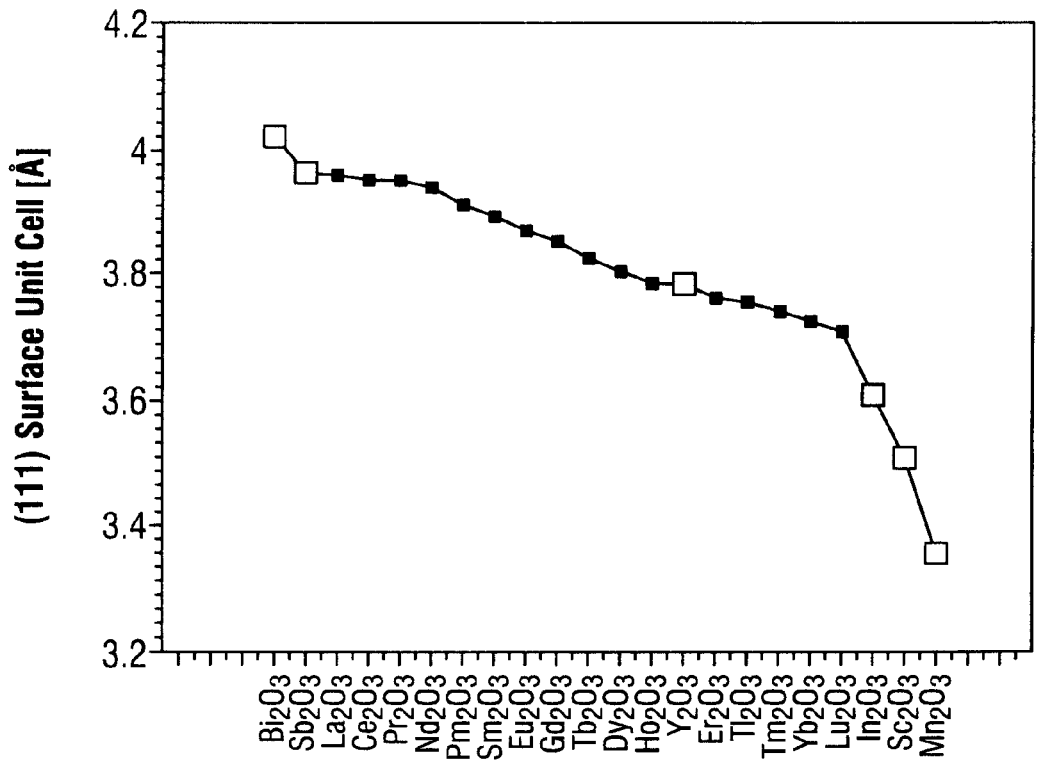
FIG. 5 shows the (111) surface unit cell dimensions (in Å) of various cubic metal oxides having Ia-3 symmetry.
Figure 6:
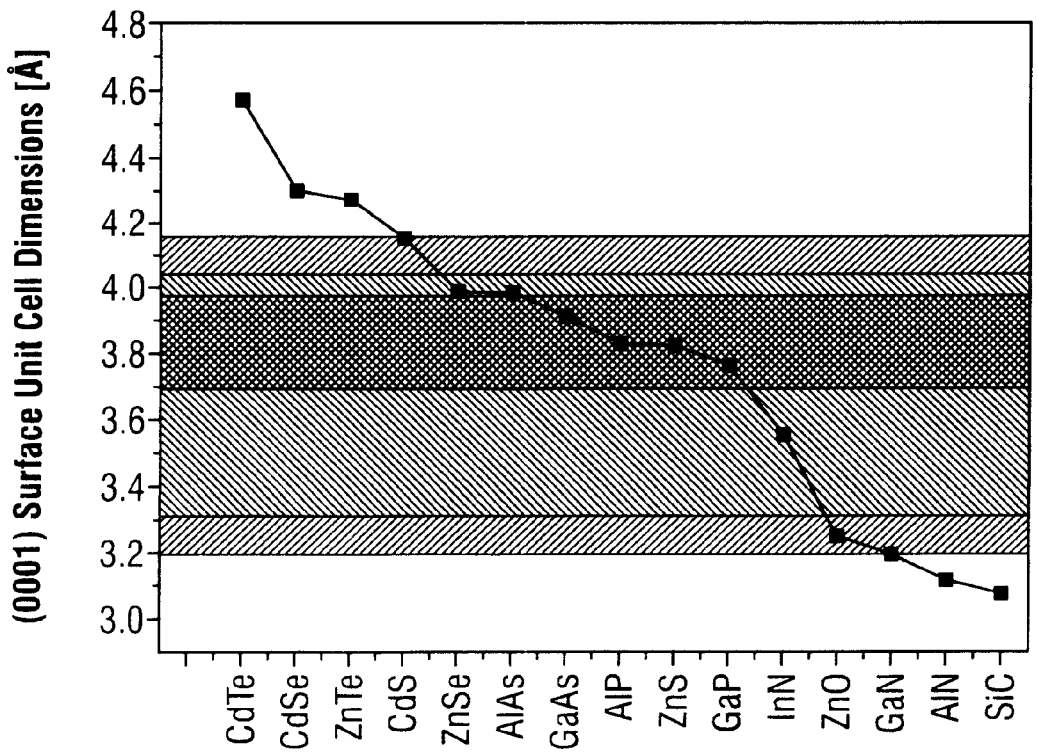
FIG. 6 shows the (0001) surface unit cell dimensions of hexagonal semiconductor materials.

FIGS. 5 and 6 show the equivalent data for the case when the substrate wafer has a Si(111) surface orientation. FIG. 5 depicts the (111) surface unit cell dimensions (in Å) of the same cubic metal oxides as shown in FIG. 3. FIG. 6 shows the (0001) surface unit cell dimensions (in Å) of various hexagonal semiconductor materials which can be used as materials for the superficial layer 8. The surface unit cell dimensions of all cubic (111) $M_2O_3$ Ia-3 crystal surfaces are within a few percent twice as big as the (0001) basal planes of the most common hexagonal semiconductor structures. In this way, the heteroepitaxy of (0001) oriented hexagonal semiconductors on these cubic oxides with (111) orientation results in the formation of a (2×2) coincidence lattice as the most dense configuration. For an easier evaluation of lattice matching opportunities, the (0001) unit cell dimensions of the hexagonal semiconductors (FIG. 6) are compared with half the values of the lattice dimensions of the cubic (111) $M_2O_3$ Ia-3 oxide surface planes (FIG. 5). The shaded areas in FIG. 6 have the same meaning as in FIG. 4.

Furthermore, the superficial layer 8 of one and the same material can often be integrated in a fully relaxed or strained way. The high flexibility of this approach offers, in principle, the ability to prepare epitaxial layer systems on the Si technology platform with either up to now unachieved structural quality (defect densities of not more than $10^{12}/cm^2$ etc.) or even open the way towards integration approaches for new materials which were up to now not feasible.

A further important advantage is the fact that the metal oxides having Ia-3 structure are well known for their high oxygen conductivity. This property plus the option to integrate an internal oxygen reservoir, e.g. in form of $PrO_2$, offers the advantage to form amorphous intermediate layers 2, 7 between the epitaxial oxide layers 3-6 and the Si substrate wafer 1 and, if necessary, between the epitaxial oxide layers 3-6 and the superficial layer 8. These intermediate layers are important to decouple the lattice in order to avoid defect generation by geometrical lattice mismatch as well as thermal mismatch. Certainly, the high structural quality of the epitaxially deposited superficial layer 8 results in excellent electric properties (charge carrier mobility, life times, mean time to failure etc.). Furthermore, the amorphous intermediate layers 2, 7 play a crucial role in adjusting the electric properties of the hetero-structure (insulation of the oxide, capacitance, interface traps etc.).

In addition, some of the Ia-3 $A_2O_3$ oxides like $Y_2O_3$ show high thermal conductivity, an advantage for many applications in the field of highly scaled microelectronic devices.

The present invention allows the manufacture of high-quality SOI wafers only by epitaxial deposition and thermal treatment steps. It is preferably applied to virgin silicon wafers without any device structures. The layers according to the invention are preferably deposited on at least one complete flat surface of a silicon wafer.

Methods for Epitaxial Deposition of Layers:

Both the bixbyite mixed oxide components as well as the semiconductor can be deposited either by physical or chemical vapour deposition methods abbreviated by PVD and CVD, respectively. In case of PVD, the target materials are either heated by common electron bombardment and/or thermal evaporation techniques. In case of CVD, the various well-established CVD techniques are applied (high pressure CVD, liquid pulse CVD etc.). Deposition temperatures are in the range of 200 to 1200° C., but growth conditions with a thermal budget in the range of 400 to 800° C. are preferred. The evaporation flux from the various targets can be adjusted to prepare the mixed films of the desired compositions (e.g. mixed buffer oxide films with stoichiometry gradients, compound semiconductor films like SiGe etc.). Deposition fluxes are typically in the range of 1 to 100 nm/sec.

Measurement Methods:

Structure: Film and interface layer thicknesses as well as the respective roughness of the surfaces and interfaces is non-destructively probed by interference techniques (e.g. X-ray reflectometry and ellipsometry). Scanning probe techniques like AFM and STM can furthermore be applied to quantify surface roughness parameters. The crystalline quality of the layers is mainly characterized by X-ray diffraction techniques. In-plane and out of plane X-ray diffraction measurements serve to determine the epitaxial relationships of the oxide buffer and semiconductor layers with respect to the Si substrate wafer. X-ray diffraction furthermore gives highly averaged information about the long-range order of the films, i.e. defect densities and strain effects can be quantified. These results on defect densities and strain can be further corroborated by TEM and Raman studies. The stoichiometry of the heterostructure is studied non-destructively by RBS or destructively with the help of XPS and Tof-SIMS sputtering techniques. The latter technique is also applied to determine with high sensitivity impurity levels in the heterostructure.

Electrical properties: Leakage studies are carried out by J-V measurements (temperature dependent; transient etc.). These measurements are supplemented by frequency dependent C-V measurements to study the behaviour of the dielectric constant of the buffer oxide as well as interface state densities. DLTS can be furthermore applied to study interface as well as trap states at the oxide/semiconductor boundary. Hall measurements serve to determine charge carrier concentrations as well as mobilities in the epitaxial semiconductor layers.

EXAMPLES

Example 1

Heteroepitaxy of a Superficial Layer 8 Consisting of Silicon-Germanium ($Si_{1-a}Ge_a$, a=0 to 1; "SiGe") on a Si(001) Substrate Wafer 1 Via Bixbyite Related Oxide Buffer Layers In accordance with one embodiment of the invention (cf. FIG. 2), a structure is provided which is suitable for the global integration of a heteroepitaxial superficial layer 8 consisting of SiGe on a Si(001) substrate wafer 1 via mixed buffer oxide layers of the Ia-3 type, spanning thereby the whole range of possible compositions from a=0 (100% Si) up to a=1 (100% Ge). The advantages of the present invention consist in the preparation of single crystalline superficial layers 8 consisting of SiGe of a) high structural quality by matching the required lattice dimensions with the help of appropriate mixed buffer oxide mixtures and b) high electric interface quality by introducing insulating metal silicate or silicon dioxide interface layers between the semiconductor structures and the oxide buffer through post-deposition treatments.

A) Preparing the Starting Oxide Template Structure on Si(001)

The substrate wafer 1 (step a)) can be an Si(001) wafer, as for example commonly used in making Si-based integrated circuits (IC's). After applying established Si(001) wafer cleaning recipes (RCA, Piranha etc.), a first oxide layer 3 consisting of a mixed double oxide $(Pr_2O_3)_{1-x}(Y_2O_3)_x$ with a value of x of 0.5 is grown by cube-on-cube epitaxy in (001) orientation in step b). The phase and the epitaxial relationship of the films is determined here and in the following by XRD. The film stoichiometry is analysed here and the following with the help of quantitative XPS, optionally once calibrated by RBS. The use of a 50:50 mixture of $Pr_2O_3$ and $Y_2O_3$ is required to grow a first oxide layer 3 which perfectly matches the lattice dimensions of Si (lattice constant a=5.431 nm). The thickness of the first oxide layer 3 typically is in the range of 10 to 100 nm. Film thicknesses are determined here and in the following non-destructively by XRR measurements. Subsequently, an about 10 nm thick second oxide layer 4 consisting of $(Pr_2O_3)_{1-y}(Y_2O_3)_y$ with a gradual reduction of the $Y_2O_3$ content to zero (y=0) is deposited in step c). This structure serves as template for the growth of a third oxide layer 52 consisting of stoichiometric $Pr_2O_3$ of about 10 nm thickness in step d). Without cooling down the wafer, a thermal treatment (post-deposition annealing, "PDA") is then applied in step e), heating the materials system in one atmosphere of oxygen for 30 minutes at about 500° C. Substrate temperature measurements are carried out here and in the following with thermocouple elements positioned close to the substrate. The PDA step serves to simultaneously achieve the following two main goals. Firstly, the high oxygen conductivity of the bixbyite-related oxide structures allows the post-deposition oxidation of the boundary between the substrate wafer 1 and the first oxide layer 3 at moderate temperatures through even relatively thick oxide layers. Besides decoupling the first oxide layer 3 from the substrate wafer 1 to avoid defect generation by different thermal expansion coefficients ("thermal mismatch effects"), the resulting first amorphous intermediate layer 2, either of a metal silicate or a silicon dioxide stoichiometry, provides a dielectric structure of high electric quality (highly insulating, low interface state densities, low capacitive coupling by low-k values etc.). The electrical properties are determined here and in the following by frequency and temperature dependent CV and JV measurement techniques.

Secondly, after the formation of the first amorphous intermediate layer 2, the ongoing PDA treatment oxidizes the stoichiometric $Pr_2O_3$ of the third oxide layer 50 of about 10 nm thickness to $PrO_2$ and thus transforms it into the third oxide layer 51. Of all rare earth (RE) oxides, only praseodymium and cerium oxides form besides the trivalent also four valent oxide compounds. Praseodymium oxide offers the advantage that $Pr_2O_3$ as well as $PrO_2$ are stable compounds whereas in case of cerium a strong tendency towards $CeO_2$ exists. The $PrO_2$ compound is known in this respect for its weakly bound lattice oxygen so that, as discussed in the following, this compound is used in this embodiment of the present invention as an "internal oxygen reservoir" to achieve later on the oxidation of the boundary between the buried oxide and the superficial layer 8 consisting of semiconductor material by releasing the lattice oxygen during subsequent PDA steps.

B1) Integrating Relaxed and Strained Superficial Layers 8 of Epitaxial Silicon The present invention offers the option to integrate fully relaxed as well as either strained or compressed epitaxial silicon layers on the Si(001) substrate wafer 1. Strain and relaxation phenomena are determined by high-resolution X-ray diffraction and Raman spectroscopy techniques. For this purpose, the starting oxide template structure of part A is epitaxially overgrown by a compositionally graded fourth oxide layer 6 consisting of $(Pr_2O_3)_{1-z}(Y_2O_3)_z$ of about 10 nm thickness in step f). The double oxide film growth starts with a composition of z=0.9 to fit the lattice constant of $PrO_2$ (a=0.533 nm); later on its composition is changed to adjust its lattice dimensions for the growth of a superficial layer 8 of either fully relaxed or strained epitaxial Si(001). Firstly, an epitaxial superficial layer 8 of Si(001) under tensile strain can be grown if the $Y_2O_3$ content is reduced to zero (z=0). A pure $Pr_2O_3$ top layer results whose lattice dimension is by about 2.5% bigger than the crystal structure of silicon. In this respect, the epitaxial overgrowth by Si in step g) is suitable to prepare a superficial layer 8 of Si(001) with a device relevant strain to raise electron as well as hole mobility. Secondly, in case of the overgrowth by the compositionally graded fourth oxide layer 6 consisting of $(Pr_2O_3)_{1-z}(Y_2O_3)_z$ ending with z=0.5 in step f), the oxide template matches the Si lattice dimensions and is therefore appropriate to create a fully relaxed superficial layer 8 of Si(001) in step g). Thirdly, the compositionally graded fourth oxide layer 6 consisting of $(Pr_2O_3)_{1-z}(Y_2O_3)_z$ ending with a pure $Y_2O_3$ (z=1) layer on top provides a template for semiconductor growth whose lattice dimension is by about 2.5% smaller than Si. This procedure enables that way in step g) the growth of a superficial layer 8 of epitaxial Si(001) which is under device relevant compressive stress. A final PDA treatment is applied in step h) to decouple the either strained or relaxed superficial layer 8 of Si(001) from the oxide template. Again, the high oxygen conductivity of the Ia-3 related $(Pr_2O_3)_{1-z}(Y_2O_3)_z$ double oxide of the fourth oxide layer 6 is the central physical property which makes it feasible to use the weakly bound lattice oxygen of the $PrO_2$ of the third oxide layer 51 to achieve the oxidation of the boundary between the epitaxial superficial layer 8 of Si(001) and the fourth oxide layer 6. In this process, the buried $PrO_2$ of the third oxide layer 51 is reduced to $Pr_2O_3$, thereby transforming this layer into third oxide layer 52, while a second amorphous intermediate layer 7 of a metal silicate or $SiO_2$ is formed at the interface. The creation of the second amorphous intermediate layer 7 before cooling down the grown materials stack is an important requirement to avoid defect creation due to the different thermal expansion coefficients of the oxide and the semiconductor of the superficial layer 8 as well as to guarantee high quality electric properties (insulation, low charge trapping densities etc.).

B2) Integrating Strained and Relaxed Superficial Layers 8 of Epitaxial $Si_{1-a}Ge_a$ (a=0 to 1)

The oxide support systems discussed in part B2 can certainly be used for the integration of relaxed as well as strained superficial layers 8 of epitaxial SiGe films of different stoichiometries. Firstly, various relaxed SiGe layers can be grown on top of lattice matched fourth oxide layers 6 of $(Pr_2O_3)_{1-z}(Y_2O_3)_z$ double oxide films. For example, superficial layers 8 of SiGe with a Ge content of 80% grow fully relaxed on lattice matched fourth oxide layers 6 of $(Pr_2O_3)_{1-z}(Y_2O_3)_z$ films when z equals 0. Secondly, stressed SiGe layers under tensile as well as compressive strain can be realized. For example, 100% Ge layers experience a compressive strain on a fourth oxide layer 6 of $(Pr_2O_3)_{1-z}(Y_2O_3)_z$ all possible compositions from z=0 to 1. To grow, however, a fully relaxed superficial layer 8 of epitaxial $Si_{1-a}Ge_a$ film up to a composition of a=1 on an Ia-3 related fourth oxide layer 6, a new oxide compound is needed in the fourth oxide layer 6 whose lattice dimension is big enough. The best choice is the very efficient oxygen ion conductor $Bi_2O_3$ (lattice constant a=0.566 nm) which slightly exceeds the lattice dimensions of Ge (a=0.5658 nm). A compositionally graded fourth oxide layer 6 of $(Bi_2O_3)_{1-x}(Y_2O_3)_x$ of about 10 nm thickness is grown in step f) on top of the third oxide layer 51 described in detail in part A. The oxide growth in step f) starts with a $(Bi_2O_3)_{1-z}(Y_2O_3)_z$ composition of z=0.92 to match the lattice dimensions of $PrO_2$ (a=0.533 nm). Then, the $Bi_2O_3$ ratio is raised to match the lattice dimensions of the targeted superficial layer 8 of epitaxial SiGe. For example, to achieve the growth of fully relaxed 100% Ge films in step g), perfect lattice matching is achieved by a fourth oxide layer 6 of $(Bi_2O_3)_{1-z}(Y_2O_3)_z$ with a composition of z=0.03 in its top layer region. Finally, prior to cooling, PDA treatments are applied in step h) to activate the oxygen diffusion from the buried "oxygen reservoir" $PrO_2$ of third oxide layer 51 to the boundary between the fourth oxide layer 6 and the superficial layer 8. While the $PrO_2$ of the third oxide layer 51 is reduced in this process to $Pr_2O_3$, the second amorphous intermediate layer 7 of a metal silicate or $SiO_2$ is created by oxidation of the buried interface. The role of the interface layer in part B2 is the same as discussed in detail in part B1.

Example 2

Heteroepitaxy of Indium Nitride (InN) and Gallium Nitride (GaN) Films on an Si(111) Substrate Wafer 1 Via Bixbyite Related Oxide Buffers In accordance with another embodiment of the invention (cf. FIG. 2), a structure is provided which is suitable for the global integration of hexagonal wurtzite InN(0001) and GaN (0001) films on a substrate wafer 1 of Si(111) via mixed buffer oxide layers of the Ia-3 type. The phase and the epitaxial relationship of the films is determined here and in the following by XRD. The coexistence of cubic sphalerite and hexagonal wurtzite crystal structures among III-V and II-VI compound semiconductors breaks the dominance of the Si(001) wafer orientation, technologically well-established over the entirely cubic IV-IV semiconductor world. It is an advantage of the present invention that it provides sufficient flexibility to tackle also the integration challenge of new valuable semiconductor materials crystallizing in the hexagonal wurtzite structure. As the low-index (0001) basal plane is the most stable surface orientation of wurtzite related structures, the pseudohexagonal Si(111) substrate surface is the best choice to meet the lattice symmetry of these semiconductor films. Bixbyite related buffer oxide structures grow on Si(111) substrates in the cubic (111) surface orientation. This result is understandable because this surface plane is in case of cubic crystals the most dense and therefore the most stable orientation. Besides the lattice matching and interface engineering strategies of the present invention discussed in detail in Example 1, the growth of heteroepitaxial film structures with stable surface orientations is a further advantage in case of the integration of wurtzite related semiconductors on the Si(111) platform via bixbyite related oxide buffers.

A) Preparing the Starting Oxide Template Structure on Si(111)

The substrate wafer 1 can be an on- or off-oriented Si(111) wafer and is cleaned according to well established Si(111) cleaning recipes (RCA, Piranha, $NH_4F$ etch etc.). The preparation of the oxide template structure (steps a) to e)) on Si(111) follows closely the description given in part A) of Example 1. The main difference is that the mixed double oxide $(Pr_2O_3)_{1-x}(Y_2O_3)_x$ (x=0.5 to 0) of the first oxide layer 3 and the second oxide layer 4 as well as the $PrO_2$ of the third oxide layer 51 grows on Si(111) in the cubic (111) surface orientation. The film stoichiometry is analyzed here and the following with the help of quantitative XPS, optionally once calibrated by RBS.

B1) Integrating Relaxed Hexagonal Wurtzite Epitaxial InN (0001) Layers

The oxide template structure of part A is epitaxially overgrown in step f) by a single crystalline fourth oxide layer 6 of $(Pr_2O_3)_{1-z}(Sc_2O_3)_z$ with (111) surface orientation. Lattice matching with respect to the surface unit cell dimensions of the cubic $PrO_2$(111) plane is achieved by using a composition characterized by z=0.37. In order to match the rather small lattice dimensions of the hexagonal InN(0001) basal plane (lattice constant a=0.355 nm), a compositionally graded fourth oxide layer 6 of $(Pr_2O_3)_{1-z}(Sc_2O_3)_z$ must be deposited whose composition in the top surface layer region approaches z=0.85. Subsequently, in step g) a fully relaxed superficial layer 8 of hexagonal InN with (0001) surface orientation can be deposited. Prior to cooling, in step h) PDA treatments are applied to carry out the decoupling of the superficial layer 8 and the fourth oxide layer 6 via the interface oxidation, using the weakly bound lattice oxygen of the $PrO_2$ of the third oxide layer 51.

B2) Integrating Strained Hexagonal Wurtzite Epitaxial GaN (0001) Layers

For the integration of epitaxial GaN(0001) films, a compositionally graded fourth oxide layer 6 of $(Pr_2O_3)_{1-z}(Mn_2O_3)_z$ with (111) orientation must be used. The epitaxial overgrowth of the oxide template of part A is achieved by a lattice matching double oxide structure $(Pr_2O_3)_{1-z}(Mn_2O_3)_z$ with z equal to 0.28. With increasing thickness of the fourth oxide layer 6, the content of $Pr_2O_3$ is reduced to zero. The use of stoichiometric $Mn_2O_3$ in the top surface region of the double oxide structure is due to the fact that, among all the known bixbyite related oxide structures of the periodic system of elements, $Mn_2O_3$ is the crystal structure with the smallest lattice dimensions. In consequence, the surface unit cell dimensions of the cubic $Mn_2O_3$ (111) plane (lattice constant a=0.333 nm) match the rather small values of the GaN (0001) basal plane (lattice constant a=0.319 nm) the best. Also the bixbyite buffer oxide approach is not suitable to perfectly match the lattice dimensions of GaN, it is however an important advantage of the present invention that the remaining lattice misfit of about 4% between the supporting oxide buffer and the superficial layer 8 of hexagonal GaN (0001) is by a factor of 4 smaller than in case of the nowadays used SiC and $Al_2O_3$ substrates for GaN heteroepitaxy. Besides the smaller lattice misfit, the decoupling step h) of the superficial layer 8 and the fourth oxide layer 6 by an interface oxidation during the PDA step is a further improvement brought about by the present invention to make the heteroepitaxy of GaN films (step g)) on foreign substrates with lower defect densities feasible.

Example 3

Step a) Providing an Si(111) Substrate:

The global integration of (0001) oriented single crystalline wurtzite InN films of high quality in the Si technology platform starts with a monocrystalline substrate wafer 1 consisting of silicon (Si) and having (111) orientation. The phase and the epitaxial relationship of the films is determined here and in the following by XRD. This Si surface orientation is chosen because the cubic Si(111) crystal plane offers a pseudo-hexagonal surface symmetry which is the best suited to achieve the global integration of III-V compound semiconductor layers, crystallizing in the hexagonal wurtzite structure. The Si(111) wafer has a diameter of 300 mm, is with a precision of ±0.5° on-oriented and undoped. The electrical properties are determined here and in the following by frequency and temperature dependent CV and JV measurement techniques. It is cleaned by the standard Si(111) wafer cleaning techniques well established in Si-based microelectronics. The Si(111) wafer is exposed to a Piranha wet etching followed by a further treatment in 40% $NH_4F$ solution for 30 minutes and rinsed afterwards in de-ionized water. This recipe is known to result in atomically smooth Si(111) surfaces. Subsequently, the hydrogen terminated Si(111) wafers are inserted immediately after the wet chemistry treatment in the oxide deposition chamber. Here, prior to oxide growth, the Si(111) wafers are annealed under ultra high vacuum conditions at 700° C. to desorb the hydrogen and prepare (7×7) Si(111) reconstructed starting surfaces. Surface reconstructions are determined here and in the following by RHEED techniques.

Step b) Deposition of a First Oxide Layer 3 Consisting of $(Pr_2O_3)_{0.5}(Y_2O_3)_{0.5}$:

The oxide deposition starts with a high quality oxide seed layer which matches the Si lattice dimensions as precisely as possible. This oxide seed layer is single crystalline and crystallizes in a cubic Ia-3 crystal structure. Its epitaxial relationship with respect to the Si(111) orientation is given by the fact that its (111) surface normal is aligned parallel to the Si(111) surface normal and it matches the in-plane symmetry by aligning its <11-2> direction along the Si<-1-12> azimuths. This epitaxial orientation is called a type B epitaxy of the oxide film on the Si(111) substrate. This oxide seed layer is prepared by using a mixed $(Pr_2O_3)_{1-x}(Y_2O_3)_x$ layer with a composition x equivalent to about 0.5. The film stoichiometry is analyzed here and the following with the help of quantitative XPS, optionally once calibrated by RBS. This stoichiometry results from the fact that the bulk lattice constants of $Pr_2O_3$ and $Y_2O_3$ are by a factor of about 2% too big and too small, respectively, with respect to the cubic Si crystal structure (a=5.431 nm). The $(Pr_2O_3)_{0.5}(Y_2O_3)_{0.5}$ film is prepared via co-evaporation from separated $Pr_2O_3$ and $Y_2O_3$ crucibles by adjusting accordingly the calibrated materials fluxes with the power output of the electron beam bombardment cells. Only target materials of high purity in the range of 99.99 to 99.999% according to the product specifications are loaded in the evaporation crucibles. A Si(111) substrate temperature of 750° C. is chosen to achieve the formation of a mixed $(Pr_2O_3)_{0.5}(Y_2O_3)_{0.5}$ film on the Si(111) wafer. Substrate temperature measurements are carried out here and in the following with thermocouple elements positioned close to the substrate. The high quality $(Pr_2O_3)_{0.5}(Y_2O_3)_{0.5}$ seed layer on Si(111) is 10 nm thick and grows with a rate of 0.5 nm/sec. The growth rate calibration is carried out by XRR thickness measurements as a function of deposition time. Film thicknesses are determined here and in the following non-destructively by XRR measurements.

Step c) Deposition of a Compositionally Graded Second Oxide Layer 4 Consisting of $(Pr_2O_3)_{1-y}(Y_2O_3)_y$ with y=0.5 to 0:

Subsequently, a compositionally graded $(Pr_2O_3)_{1-y}(Y_2O_3)_y$ layer with the same epitaxial relationship as the oxide seed layer with respect to the Si(111) substrate is grown on top by gradually reducing the $Y_2O_3$ content y from 0.5 to 0. This change in oxide composition is finished after a thickness of the compositionally graded $(Pr_2O_3)_{1-y}(Y_2O_3)_y$ film of 10 nm.

Step d) Deposition of the Third Oxide Layer 50 Consisting of $Pr_2O_3$:

Without interrupting the growth process, a 20 nm thick pure $Pr_2O_3$ layer is grown on top of the compositionally graded $(Pr_2O_3)_{1-y}(Y_2O_3)_y$ layer structure. During this growth step of the engineered wafer structure, the growth temperature is kept approximately constant at 750° C. and films grow at a thickness rate of 0.5 nm/sec.

Step e) Formation of the First Amorphous Intermediate Layer 2 and Oxidation of the Third Oxide Layer 50:

This structure is in the following exposed to a post-deposition annealing (PDA) treatment to simultaneously a) introduce an amorphous interface film structure (=the first amorphous intermediate layer 2) between the Si substrate wafer 1 and the oxide buffer consisting of the first to third oxide layers 3, 4, 50 and b) to oxidize the pure $Pr_2O_3$ film 50 on top to stoichiometric $PrO_2$ (=third oxide layer 51). It is possible to prepare an about 5 nm thick amorphous intermediate layer 2 under a 50 nm thick oxide heterostructure of the here described nature by exposing the structure to a PDA treatment in one atmosphere of molecular oxygen for 30 minutes at a temperature of 600° C. Hot wafer handling is an important requirement to avoid defect generation by thermal cycling of the heterostructure at this stage. XPS and Tof-SIMS sputtering techniques established that the amorphous intermediate layer 2 exhibits a silicate stoichiometry with an almost pure $SiO_2$ layer in direct contact with the Si substrate wafer 1. Accordingly, no metal contamination in the Si wafer structure itself was detectable.

During the same PDA treatment, the 20 nm thick pure $Pr_2O_3$ layer (third oxide layer 50) on top is completely oxidized to $PrO_2$ (third oxide layer 51). The (111) oriented $PrO_2$ has the same epitaxial relationship as the $(Pr_2O_3)_{1-x}(Y_2O_3)_x$ heterostructure with respect to the Si(111) substrate and presents the final oxidation product of $Pr_2O_3$ when the latter is exposed to oxygen pressures exceeding 200 mbar at temperatures above 300° C.

Step f) Deposition of the Fourth Oxide Layer 6 in Order to Match the Lattice Dimensions of the Superficial Layer 8 Consisting of a Semiconductor Material:

The next step f) consists in adjusting the lattice dimensions of the Ia-3 based oxide buffer layer for the deposition of the single crystalline, functional (0001) oriented InN superficial layer 8 with wurtzite structure. Due to the rather small lattice dimensions of the hexagonal InN (0001) basal plane (a=0.3548 nm) with respect to the Si(111) surface lattice dimensions (a=0.384 nm), the $Pr_2O_3$ must be alloyed with an Ia-3 oxide with a substantially smaller lattice dimension. In the present case, $Sc_2O_3$ is used with a (111) surface unit cell dimension of a=0.348 nm. The material is again electron beam evaporated from an individual cell filled with a target of high purity (99.99 to 99.999%). The compositionally graded $(Pr_2O_3)_{1-z}(Sc_2O_3)_z$ layer is deposited by co-evaporation at a growth temperature of 750° C. on top of the single crystalline (111) oriented $PrO_2$ layer. The $(Pr_2O_3)_{1-z}(Sc_2O_3)_z$ film is single crystalline and exhibits the same epitaxial relationship as the deposited $(Pr_2O_3)_{1-y}(Y_2O_3)_y$ (y=0.5 to 0) heterostructure with respect to the Si(111) substrate. To match the lattice dimensions of the $PrO_2$ (111) and of the InN (0001) surface unit cells, the composition of the $(Pr_2O_3)_{1-z}(Sc_2O_3)_z$ is gradually varied over a thickness range of typically 10 to 20 nm from z=0.37 to z=0.85. To stabilize the lattice adjusted $(Pr_2O_3)_{1-z}(Sc_2O_3)_z$ heterostructure and achieve a flat oxide buffer with roughness limited to the atomic scale for the integration of the functional InN film, a $(Pr_2O_3)_{0.15}(Sc_2O_3)_{0.85}$ oxide layer with a thickness of 5 nm is optionally deposited in addition.

Step g) Deposition of the Superficial Layer 8 Consisting of Single Crystalline (0001) Oriented Wurtzite InN:

The InN film grows on the oxide buffer by evaporating highly purified metallic In (99.99 to 99.999%) from a Knudsen cell which reacts with nitrogen in the chamber introduced via a gas system. Nitrogen brought to reaction with In is atomic nitrogen created in the plasma source assisted growth techniques. The InN crystallizes in the (0001) oriented wurtzite structure. The growth temperature is in the range of 750° C. and the 200 nm thick epitaxial InN film grows at a rate of 0.5 nm/sec. The (0001) oriented InN is found to grow single crystalline on the oxide buffer by aligning its in-plane vectors <10-10> along the <01-1> azimuths. This epitaxial relationship of the InN film on the (111) oriented cubic oxide buffer layer of Ia-3 based crystal structure can be explained by the facts that a) the (0001) basal plane is among the most stable surface orientations of wurtzite III-V compound semiconductors and that b) the $(Pr_2O_3)_{0.15}(Sc_2O_3)_{0.85}$ oxide buffer lattice dimensions are adjusted for matching the InN(001) in-plane dimensions.

Step h) Formation of the Second Amorphous Intermediate Layer 7:

By hot wafer handling techniques under a protective nitrogen atmosphere, the engineered wafer structure is exposed immediately after the InN deposition to a second PDA treatment. The aim of this second PDA treatment is again twofold, namely a) to decouple the lattice structure of the functional InN layer (=superficial layer 8) from the oxide buffer (comprising first to fourth oxide layers 3, 4, 51, 6) to avoid undesired defects by thermal mismatch problems and b) to improve the long-range order of the InN film structure by temperature treatments.

Amorphous interface film structure preparation: The InN film is decoupled from the oxide buffer by the post-deposition preparation of an amorphous intermediate layer 7 between the oxide buffer and the InN layer 8. For this purpose, the $PrO_2$ layer 51, embedded in the heterostructure, is used as an internal oxygen reservoir. Due to its loosely bound lattice oxygen, the $PrO_2$ film acts as a carrier of activated oxygen. Even at temperatures as low as 500° C., the reduction of the internal $PrO_2$ film to $Pr_2O_3$ occurs. As the Si(111)/oxide buffer interface reaction is already saturated under these conditions by the first PDA step, the released lattice oxygen is mainly adsorbed at the oxide buffer/InN boundary. Due to the high oxygen conductivity of the Ia-3 crystal structure based $(Pr_2O_3)_{1-z}(Sc_2O_3)_z$ oxide layer at these moderate conditions, an oxidation reaction is observed at the oxide buffer/InN boundary which results in the formation of an about 5 nm thick amorphous $In_2O_3$ interface layer.

High-quality single crystalline InN (0001) wurtzite films: Due to the low mobility of the metal cations of Ia-3 oxide crystals below 1000° C. and the presence of a blocking amorphous $In_2O_3$ layer at the interface, the single crystalline InN (0001) film is exposed to PDA treatments at elevated temperatures under a protective nitrogen atmosphere at 900° C. for 1 hour without risking undesired metal contaminations by diffusion processes. This thermal treatment serves to improve the long-range order of the InN film by healing out defects which result during semiconductor film growth. Single crystalline, (0001) oriented InN films prepared by this recipe show $10^7$ defects per square centimeter.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for manufacturing a semiconductor wafer, the process comprising the following steps in the order given:
   a) providing a monocrystalline substrate wafer (1),
   b) epitaxially depositing a monocrystalline first oxide layer (3) on at least one surface of the substrate wafer (1) to form a layered wafer, the first oxide layer (3) having a cubic Ia-3 crystal structure, a composition of $(M^1_2O_3)_{1-x}(M^2_2O_3)_x$ wherein each of $M^1$ and $M^2$ is a metal and wherein $0 \leq x \leq 1$, and a lattice constant which differs from the lattice constant of the material of the substrate wafer by 0% to 5%,
   c) epitaxially depositing a monocrystalline second oxide layer (4) on the surface of the first oxide layer (3) having a cubic Ia-3 crystal structure, the second oxide layer (4) having a cubic Ia-3 crystal structure, a composition of $(M^3_2O_3)_{1-y}(M^4_2O_3)_y$ wherein each of $M^3$ and $M^4$ is a metal and wherein $0 \leq y \leq 1$, y starting with a value $y^1$ at the boundary to the first oxide layer (3) having a cubic Ia-3 crystal structure, and varying y across the thickness of the second oxide layer (4) in order to achieve a variation in the lattice constant of the material of the second oxide layer (4) across its thickness, and ending with a value $y^2$ at the surface of the second oxide layer (4), the value $y^1$ being selected such that the lattice constant of the second oxide layer (4) at its boundary to the first oxide layer (3) having a cubic Ia-3 crystal structure differs from the lattice constant of the material of the first oxide layer (3) having a cubic Ia-3 crystal structure by 0% to 2% and
   e) thermally treating the resulting layered wafer under an atmosphere comprising oxygen with a partial pressure of $10^{-6}$ mbar to 1 bar at a temperature of 200 to 1000° C. for 10 to 100 minutes, thereby forming a first amorphous intermediate layer (2) at the boundary between the substrate wafer (1) and the first oxide layer (3) having a cubic Ia-3 crystal structure.

2. A process for manufacturing a semiconductor wafer, the process comprising the following steps in the order given:
   a) providing a monocrystalline silicon substrate wafer (1) having a crystal lattice orientation of Si(111),
   b) epitaxially depositing a monocrystalline first oxide layer (31) on at least one surface of the substrate wafer (1), the first oxide layer (31) having a hexagonal crystal structure, a composition of $(M^1_2O_3)_{1-x}(M^2_2O_3)_x$ wherein each of $M^1$ and $M^2$ is a metal and wherein $0 \leq x \leq 1$, and a lattice constant which differs from the lattice constant of the material of the substrate wafer by 0% to 5%,
   c) epitaxially depositing a monocrystalline second oxide layer (4) on the surface of the first oxide layer (31) having a hexagonal crystal structure, the second oxide layer (4) having a cubic Ia-3 crystal structure, a composition of $(M^3_2O_3)_{1-y}(M^4_2O_3)_y$ wherein each of $M^3$ and $M^4$ is a metal and wherein $0 \leq y \leq 1$, y starting with a value $y^1$ at the boundary to the first oxide layer (31) having a hexagonal crystal structure, and varying y across the thickness of the second oxide layer (4) in order to achieve a variation in the lattice constant of the material of the second oxide layer (4) across its thickness, and ending with a value $y^2$ at the surface of the second oxide layer (4), the value $y^1$ being selected such that the lattice constant of the second oxide layer (4) at its boundary to the first oxide layer (31) having a hexagonal crystal structure differs from the lattice constant of the material of the first oxide layer (31) having a hexagonal crystal structure by 0% to 2%, and e) thermally treating the resulting layered wafer under an atmosphere comprising oxygen with a partial pressure of $10^{-6}$ mbar to 1 bar at a temperature of 200 to 1000° C. for 10 to 100 minutes, thereby transforming the first oxide layer (31) having a hexagonal crystal structure into a first oxide layer (3) having a cubic Ia-3 crystal structure, and thereby also forming a first amorphous intermediate layer (2) at the boundary between the substrate wafer (1) and the first oxide layer (3) having a cubic Ia-3 crystal structure.

3. The process of claim 1, further comprising a step g) of epitaxially depositing a superficial layer (8) consisting of a monocrystalline semiconductor material on the surface of the second oxide layer (4), said step g) being performed after step e).

4. The process of claim 1, further comprising a step d) of epitaxially depositing a monocrystalline third oxide layer (50) on the surface of the second oxide layer (4), the third oxide layer (50) having a cubic Ia-3 crystal structure and a composition of $M^5_2O_3$, wherein $M^5$ is a metal which is also capable of forming oxides having a composition of $M^5_2O_w$ with $3<w\leq4$, said step d) being performed after step c) and prior to step e), said third oxide layer (50) having a composition of $M^5_2O_3$ being transformed during step e) into a third oxide layer (51) consisting of $M^5_2O_w$ with $3<w\leq4$.

5. The process of claim 4, further comprising a step f) of epitaxially depositing a monocrystalline fourth oxide layer (6) on the surface of the third oxide layer (51) consisting of $M^5_2O_w$ with $3<w\leq4$, the fourth oxide layer (6) having a cubic Ia-3 crystal structure, a composition of $(M^6_2O_3)_{1-z}(M^7_2O_3)_z$ wherein each of $M^6$ and $M^7$ is a metal and wherein $0\leq z\leq1$, z starting with a value $z^1$ at the boundary to the third oxide layer (51) consisting of $M^5_2O_w$ with $3<w\leq4$, varying z across the thickness of the fourth oxide layer (6) in order to achieve a variation in the lattice constant of the material of the fourth oxide layer (6) across its thickness, and ending with a value $z^2$ at the surface of the fourth oxide layer (6), said step f) being performed after step e).

6. The process of claim 5, further comprising a step g) of epitaxially depositing a superficial layer (8) consisting of a monocrystalline semiconductor material on the surface of the fourth oxide layer (6), said step g) being performed after step f).

7. The process of claim 6, further comprising a step h) of thermally treating the resulting layered wafer at a temperature of 200 to 1000° C. for 10 to 100 minutes, thereby forming a second amorphous intermediate layer (7) at the boundary between the fourth oxide layer (6) and the superficial layer (8), the second amorphous intermediate layer (7) comprising an electrically insulating material and having a thickness of 0.5 nm to 100 nm, and thereby also transforming the monocrystalline third oxide layer (51) consisting of $M^5_2O_w$ with $3<w\leq4$ into a monocrystalline third oxide layer (52) having a cubic Ia-3 crystal structure and a composition of $M^5_2O_3$.

\* \* \* \* \*